United States Patent [19]

Hoff, Jr. et al.

[11] 4,398,207

[45] Aug. 9, 1983

[54] MOS DIGITAL-TO-ANALOG CONVERTER WITH RESISTOR CHAIN USING COMPENSATING "DUMMY" METAL CONTACTS

[75] Inventors: Marcian E. Hoff, Jr., Sunnyvale; John M. Huggins, San Jose, both of Calif.

[73] Assignee: Intel Corporation, Santa Clara, Calif.

[21] Appl. No.: 263,040

[22] Filed: May 12, 1981

Related U.S. Application Data

[60] Continuation of Ser. No. 973,101, Dec. 26, 1978, abandoned, which is a division of Ser. No. 717,442, Aug. 24, 1976, Pat. No. 4,146,882.

[51] Int. Cl.³ .............................................. H01L 27/02
[52] U.S. Cl. ...................................... 357/51; 357/41; 357/59
[58] Field of Search ............................... 357/41, 51, 59

[56] References Cited

U.S. PATENT DOCUMENTS

| | | | |
|---|---|---|---|
| 3,631,309 | 12/1971 | Myers | 357/51 |
| 3,639,813 | 2/1972 | Kamoshida et al. | 357/41 |
| 3,811,076 | 5/1974 | Smith | 357/41 |
| 3,812,478 | 5/1974 | Tomisawa et al. | 357/51 |
| 4,021,789 | 5/1977 | Furman et al. | 357/59 |
| 4,131,809 | 12/1978 | Baars | 357/51 |
| 4,141,023 | 2/1979 | Yamada | 357/51 |

*Primary Examiner*—Joseph E. Clawson, Jr.
*Attorney, Agent, or Firm*—Blakely, Sokoloff, Taylor & Zafman

[57] ABSTRACT

An MOS integrated circuit digital-to-analog converter employing a plurality of generally parallel resistance strings. Decoding means and switching means provide an analog output from the resistance strings, this output passes through only two switches. The resistance strings may be closely fabricated on a substrate, thereby reducing the effects of processing variations. A unique layout for the converter array minimizes the effects of masking misalignments.

8 Claims, 9 Drawing Figures

MOS DIGITAL-TO-ANALOG CONVERTER WITH RESISTOR CHAIN USING COMPENSATING "DUMMY" METAL CONTACTS

This is a continuation of application Ser. No. 973,101 abandoned, filed Dec. 26, 1978, which is a divisional of application Ser. No. 717,442 now U.S. Pat. No. 4,146,882 filed Aug. 24, 1976.

BACKGROUND OF THE INVENTION

1. Field of the Invention

The invention relates to the field of MOS digital-to-analog converters and circuits.

2. Prior Art

Numerous digital-to-analog converters are known in the art. These converters are typically fabricated with a plurality of precision resistors and often employ bipolar devices for switching and logic functions. Metal-oxide-semiconductor (MOS) technology has not been particularly useful for fabricating digital-to-analog converters. Typical MOS processing variations make it difficult to fabricate uniform resistor strings or chains; masking misalignment adds to these problems. With MOS technology it is also difficult to fabricate an "on chip" stable reference voltage source for the resistor strings. Generally in the prior art, MOS converters use externally generated reference potentials.

One MOS digital-to-analog converter employs a multi-tap resistor (string) which is formed by diffused substrate regions. A tree-like logic array, controlled by the input digital signal, is used to select the appropriate tap on the resistor string. (This converter is discussed in more detail in conjunction with FIG. 1.) While this converter has the advantage of providing a monotonic output, that is, the output analog signal is always larger for a larger input digital signal, it has numerous disadvantages. First, in its practical layout on a substrate, a significant amount of substrate area is required. The resistor string is spread over considerable substrate area (when compared to the invented converter). This decreases the uniformity of the resistors due to MOS processing variations which in turn effects the linearity of the converter. Another disadvantage of this converter is that a long path, through many switches, exists between the selected tap and the output of the converter. Thus this prior art converter has a high output impedance.

As will be seen, the disclosed digital-to-analog converter also provides a monotonic output, however, without many of the disadvantages of the prior MOS converters. The resistor strings employed in the invented converter may be closely formed on a substrate, thereby minimizing the effects of processing variations. Moreover, through a unique layout, the effects of masking misalignments are substantially reduced. The output analog signal only passes through two switching means, thus the disclosed converter has a lower output impedance.

SUMMARY OF THE INVENTION

An MOS digital-to-analog converter for receiving an digital signal and for providing an output analog signal is described. The converter includes a plurality of resistance means and a plurality of crossing lines. First switching means are employed for selecting one of these lines. The converter employs second switching means each for selectively coupling the lines to a subset of said resistance means. The first and second switching means are controlled by gating means which receive the input digital signals. The output analog signal flows through two switching means before reaching the output line.

DETAILED DESCRIPTION OF THE INVENTION

Figure 3:
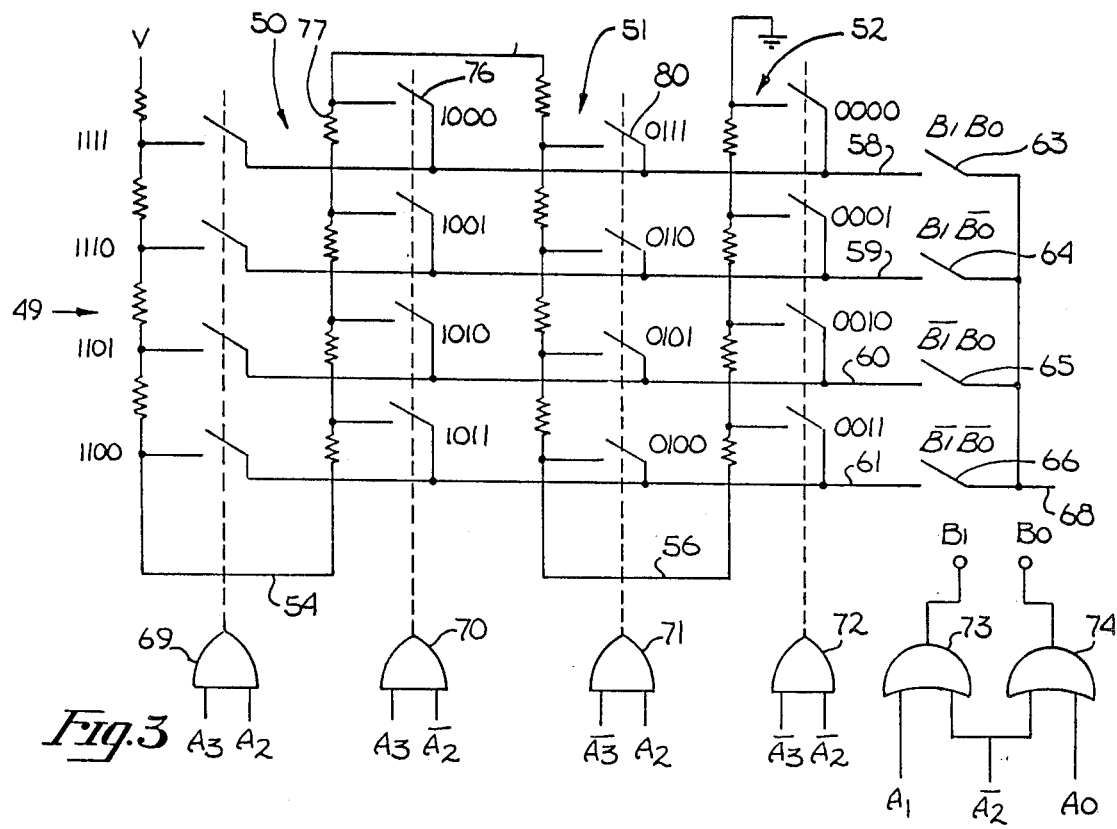
FIG. 3 is a schematic drawing of a digital-to-analog converter of the present invention where the resistance strings are folded to eliminate cross-over connections.

A digital-to-analog converter fabricated on a single silicon substrate as an integrated circuit with MOS technology is described. The converter is adaptable for receiving a conventional digital signal and for providing an output analog signal. In its presently preferred form, the converter is used to convert an eight-bit digital signal to an equivalent direct current potential. Sixteen columns of resistor strings are employed in this converter array along with sixteen transverse metal lines (rows). Since this array is too large to show in its entirety in this application, a four-bit array employing the interconnections between the resistor strings used in the eight-bit array is shown in FIG. 3. It will be obvious to one skilled in the art that this converter may be expanded to handle an input digital signal which includes any number of bits.

In its presently preferred embodiment the converter array is fabricated on a p-type silicon substrate and employs n-channel devices with polycrystalline silicon gates. The entire eight-bit converter array, without all the decoders and gating circuits requires approximately 20×30 mils of substrate area. Thus this converter may be fabricated on a substrate which substrate includes other circuitry. Some of the specific layout details, fabrication steps, conductivity types and circuits described in this application are provided to give a clear understanding of the inventive concepts. However, it will be obvious that in many instances other fabrication steps, conductivity types, circuits, and the like, may be employed. Also many well-known circuits and MOS processing steps employed in the present invention are not described in detail in this application.

Many analog-to-digital converters use digital-to-analog converters along with comparators to convert a analog signal to digital form. The digital-to-analog converter described and claimed in this application may be employed as part of an analog-to-digital converter.

In general the digital-to-analog converter of the present invention operates in a conventional manner in that a plurality of resistor means are coupled in series. The input digital signal is employed to select an appropriate tap or location along the resistor means to provide the output analog signal. The resistor means is coupled to a stable, direct current reference potential. This DC potential may be generated externally from the silicon substrate or "chip" with well-known circuits or may be generated on the substrate which includes the converter. An MOS circuit for providing a stable reference voltage is described in copending application Ser. No. 709,719 filed July 29, 1976 entitled "MOS REFERENCE VOLTAGE CIRCUIT", now U.S. Pat. No. 4,100,437. This copending application is assigned to the assignee of this application In FIG. 1 the three-bit prior art MOS digital-to-analog converter includes an elongated resistor string 15. This multi-tap resistor string is coupled to a plurality of complementary switch pairs 16. Each of these switches is controlled by the least significant bit of the input digital signal, identified As $\overline{A_0}$. Each of these switches is, in turn, coupled to switch pairs 17, which switches are controlled by the next most significant bit of the input digital signal, $A_1$ and $\overline{A_1}$. Switch pairs 17 are coupled to a switch pair 18, which switch is controlled by the next most significant bit, $A_2$ and $\overline{A_2}$. The output analog signal is sensed on the line 19.

The resistance string 15 acts as a voltage divider for the potential "V"; the input digital signal is employed to select the correct tap on the resistance string 15. It is apparent that for any three-bit digital signal the appropriate potential will appear on line 19. Each tap on the resistance string 15 is identified with the corresponding input digital signal.

Figure 1:
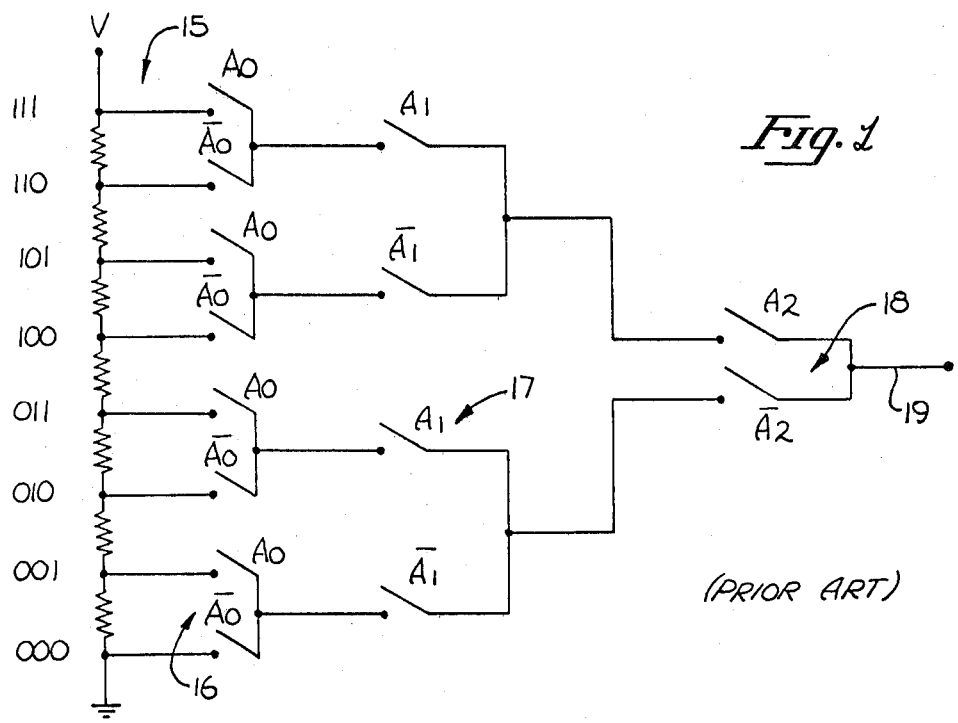
FIG. 1 is a schematic illustrating a prior art MOS digital-to-analog converter.

In the MOS integrated circuit layout for the converter of FIG. 1, particularly where the input digital signal includes a larger number of bits (e.g. eight-bits), the resistor string 15 is spread over considerable substrate area. Moreover, the output analog signal must pass through a plurality of switches before reaching the output line (e.g. 8 switches for an eight-bit converter).

Figure 2:
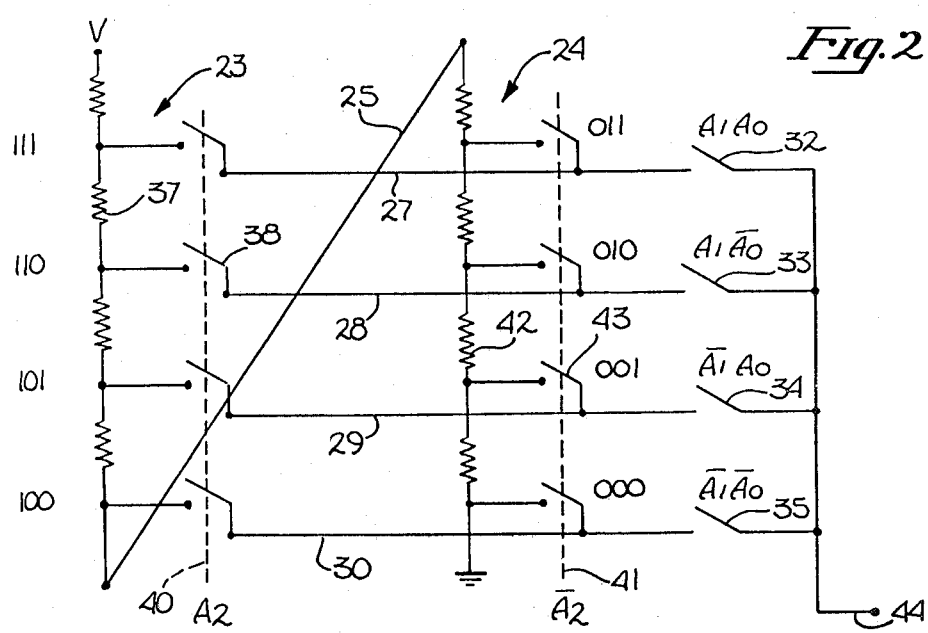
FIG. 2 is a schematic drawing of an MOS digital-to-analog converter fabricated in accordance with the present invention. This schematic is primarily used to illustrate the switching logic employed in the present invention.

In FIG. 2 a three-bit converter is illustrated employing the circuit of the present invention. In general the circuit includes a plurality of resistor strings shown as resistor strings 23 and 24, and a pluarlity of transversely disposed or crossing lines, lines 27, 28, 29 and 30. The lower end of the resistor string 23 is coupled to the upper end of the resistor string 24 by a line 25. One end of resistor string 23 is coupled to a source of direct current potential "V"; the lower end of resistor string 24 is coupled to ground. Thus the resistor strings 23 and 24 are coupled in series. Each resistor string includes a plurality of resistors or resistance means of equal resistance such as resistors 37 and 42.

The circuit of FIG. 2 employs two sets of switching means. The first set of switching means is used to couple one of the lines 27, 28, 29 or 30 to the output line 44. Switches 32, 33, 34 and 35 are employed for this purpose. The other switching means is employed to couple the lines 27, 28, 29 and 30 to one of the resistor strings 23 or 24, that is, to a subset of the resistors. Specifically, those switches along broken line 40 are simultaneously closed to couple lines 27, 28, 29 and 30 to the spaced-apart taps along the resistor string 23, or switches along line 41 are closed to couple the lines 27, 28, 29 or 30 to the spaced-apart taps along the resistor string 24.

For the three-bit converter the switches along line 40 are closed when the most significant bit, $A_2$, is a binary-one. Those switches along line 41 are closed when $A_2$ is a binary-zero, that is, for the condition $\overline{A_2}$. The switches used to couple the lines 27, 28, 29 and 30 to the output line 44 are controlled by the least two significant bits of the input digital signal. Specifically, switch 32 closes for the condition $A_1 A_0$, switch 33 for the condition $A_1 \overline{A_0}$, switch 34 for the condition $\overline{A_1} A_0$, and switch 35 for the condition $\overline{A_1} \overline{A_0}$. Ordinary decoding circuits or gates may be employed to control the switches of FIG. 2.

Assume that the input digital signal is 110. The appropriate tap along resistor string 23 which must be coupled to line 44 for this condition is identified in FIG. 2. Since the $A_2$ bit is a binary-one, those switches along line 40 are closed including switch 38 which couples the tap at resistor 37 to line 28. The switches along line 41 are open, and of the switches 32, 33, 34 and 35, only switch 33 is closed since $A_1$ is equal to a binary-one and $\overline{A_0}$ is equal to a binary-zero. Thus only one tap along the resistor strings 23 and 24 is coupled to line 44, specifically the tap between resistor 37 and switch 38.

Assume that the binary input signal is 001. For this signal all the switches along line 41 are closed, while those along 40 are open. Also, switch 34 is closed since $A_1$ is equal to a binary-zero and $A_0$ is equal to a binary-one. Thus, the tap at resistor 42 is coupled to line 44 through switches 43 and 34. As may be readily seen, for any of the possible input digital signals, which are identified along the resistor strings 23 and 24, the appropriate tap is coupled to the output line 44.

There are a number of significant differences between the circuit of FIG. 2 and the prior art circuit of FIG. 1. First, the resistor strings 23 and 24 of FIG. 2 may be in close proximity on a substrate. These resistor strings may be diffused regions in the substrate. Since the resistance strings are closely fabricated on the substrate the process variations which effect the resistance of these resistor strings are minimized. The lines 40 and 41 may be first layer metal lines or polycrystalline silicon lines used as gates for field-effect transistors. The lines 27 through 30 may be metal lines or a second layer of polycrystalline silicon. Another significant difference between the circuits of FIGS. 1 and 2 is that the potential from the appropriate tap along the resistor strings 23 or 24 passes through only two switches, for example, switches 38 and 33 for the input binary signal 110. The circuit of FIG. 2 may be expanded to convert a binary input signal with any number of bits, and still the appropriate tap or point along one of the resistor strings is coupled to the output line through only two switches. This is in sharp contrast to the converter of FIG. 1 where the output path includes an ever increasing number of switches as the input digital signal length increases.

Figure 4:
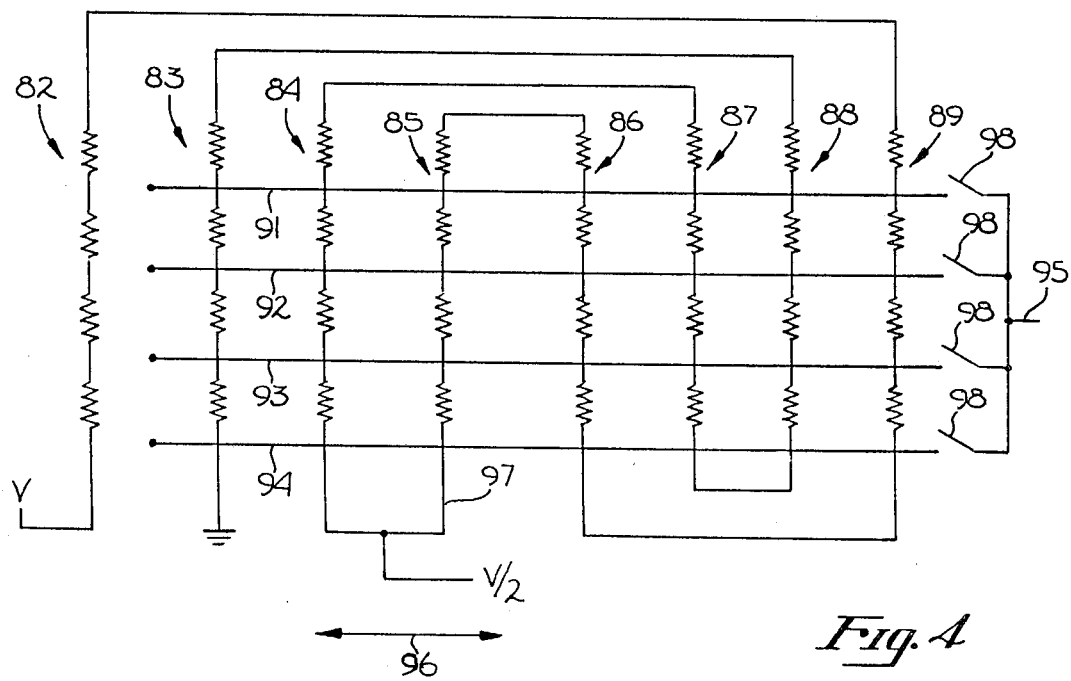
FIG. 4 is a schematic drawing illustrating alternate interconnections between resistance strings. This particular interconnection scheme is used to minimize the effects of MOS processing variations.

In the circuit of FIG. 2 the lower end of the resistor string 23 is coupled to the upper end of the resistor string 24 by the line 25. This line is not easily fabricated with standard MOS processing. In FIG. 4 a four-bit digital-to-analog converter employing the circuit principle of FIG. 2 is illustrated. However, alternate resistor strings are inverted or folded to eliminate cross-over connections, such as line 25 of FIG. 2.

In FIG. 3 the converter again includes a plurality of generally parallel resistor strings 49, 50, 51 and 52. One end of the resistor string 49 is coupled to a source of a reference potential while the other end is coupled to the lower end of resistor string 50 by line 54. The upper ends of resistor strings 50 and 51 are coupled by the line 55; and the lower ends of the resistor strings 51 and 52 are coupled by line 56. The remaining end of the resistor string 52 is coupled to ground. Thus, the resistor strings 49, 50, 51 and 52 are coupled in series between the potential "V" and ground. Each of these resistor strings again includes a plurality of taps separated by regions of equal resistance.

The array of FIG. 3 also includes a plurality of crossing lines disposed transverse to the resistor strings. Lines 58, 59, 60 and 61 may be selectively coupled to the output line 68 through switches 63, 64, 65 and 66, respectively. These lines may be coupled to the taps along resistor string 49 by a plurality of switches, which switches are controlled by the output of the AND gate 69. Similarly, lines 58, 59, 60 and 61 may be coupled to the taps along resistor string 59 when an output is present at AND gate 70, or may be coupled to string 51 when an output is present at AND gate 71, or to string 52 by an output from the AND gate 72.

The AND gates 69, 70, 71, 72 and exclusive OR gates 73 and 74 receive the input digital signal and decode this signal for controlling the various switches in the array. AND gates 69 receives the two most signficant bits $A_3$ and $A_2$, and gate 70 receives the bits $A_3$ and $\overline{A_2}$, gate 71 the bits $\overline{A_3}$ and $A_2$, and AND gate 72 the bits $\overline{A_3}$ and $\overline{A_2}$. As in the case of the circuit of FIG. 2 the switches which couple the lines 58, 59, 60 and 61 to the output line 68 are controlled by the least two significant bits, $A_1$ and $A_0$. However, because of the folding of the resistance strings 50 and 52, additional logic is required. Note that one of the two folded strings 50 and 52 is always selected by $\overline{A_2}$. This signal may be used to provide the necessary compensation for the folding. The $\overline{A_2}$ signal provides one input to each of the exclusive OR gates 73 and 74. The other inputs to these gates are $A_1$ for the gate 73, and $A_0$ for the gate 74. The outputs from the gates 73 and 74 are identified as $B_1$ and $B_0$, respectively. These outputs are used to control switches 63 through 66 in the following manner: $B_1 B_0$ operates switch 63, $B_1 \overline{B_0}$ switch 64, $\overline{B_1} B_0$ switch 65, and $\overline{B_1} \overline{B_0}$ switch 66.

Assume for sake of discussion that the input digital signal to the circuit of FIG. 3 is 1000. For this input signal an output is present at AND gate 70, no output is provided by AND gates 69, 71 or 72. Thus, lines 58, 59, 60 and 61 are coupled to the resistor string 50 and in particular, switch 76 couples line 58 to the tap associated with resistor 77. For the selected input signal $A_1$ and $A_0$ are both equal to binary-zeroes, while $\overline{A_2}$ is equal to a binary-one. This causes output signals from both exclusive OR gates 73 and 74. With $B_1$ and $B_0$ both equal to binary-ones, switch 63 closes coupling line 58 to the output line 68. This provides the appropriate analog signal on line 68. It should be noted that for the four-bit converter of FIG. 3 the path coupling the appropriate tap on a resistance strings to the output line again only includes two switches. In a similar manner for any of the possible input digital signals (which signals are indicated along the resistor strings) the appropriate analog signal is provided on the output line 68.

For the presently preferred embodiment of the 8-bit converter 4-bits are used to select one of the 16 columns and the least significant 4-bits are used to select one of the 16 rows (metal lines). One of the four more significant bits is used in the decoding circuits for the row selection to compensate for the folding of the resistor strings such as in the case of FIG. 3.

In FIG. 4 alternate interconnections between the resistor strings are illustrated which connections minimize the effects of MOS processing variations. The partially illustrated converter array in FIG. 4 again includes a plurality of parallel resistor strings 82 through 89. Transverse lines 91 through 94 may be selectively coupled to the output line 95 through a plurality of switches 98. The switches used to couple lines 91, 92, 93 and 94 to the taps along the resistor strings are not illustrated in FIG. 4 in order not to over complicate this drawing. For the embodiment of FIG. 4 the lower end of resistor string 82 is coupled to the potential "V" while the lower end of resistor string 83 is coupled to ground. The upper ends of resistor strings 82 and 89 are connected, as are the upper ends of resistor strings 83 and 88, 84 and 87, and 85 and 86. The lower ends of resistor strings 84 and 85 are interconnected by line 97, and similarly the lower ends of resistor strings 86 and 89 and strings 87 and 88 are connected. Thus the strings 82 through 89 are coupled in series.

Assume that the MOS processing results in resistance variations in the resistor strings in the directions indicated by arrow 96. By interconnecting the outer strings 82 and 89 directly in series, and so on, as shown in FIG. 4, the results of these variations on the output analog signal are minimized. That is, by way of example, those resistors with the lower resistance values are not all at one end of the series resistance path, but rather are evenly dispersed throughout this path. Appropriate changes to the decoding circuits which changes will be obvious to one skilled in the art, are employed to control the switches for the converter array of FIG. 4.

Additional accuracy may be obtained from the converter array by maintaining the midpoint of the series resistance path at V/2. For example, in FIG. 4 line 97 is shown coupled to a potential V/2. A trimming network may be coupled to this midpoint to adjust the potential to V/2. This network may include a plurality of resistors and programmable devices such as fusible links for providing any needed connection. An example of such a trimming network is shown in copending application Ser. No. 709,719, filed July 29, 1976, entitled "MOS REFERENCE VOLTAGE CIRCUIT," now U.S. Pat. No. 4,100,437.

Referring again to FIG. 3, in the presently preferred embodiment, the resistor strings comprise doped, elongated spaced-apart (parallel) regions in a substrate. The switches such as switch 76 each comprise a field-effect transistor; the gates of the transistors along a line are formed by an elongated polycrystalline silicon line disposed generally parallel to the resistor strings. The transverse lines such as lines 58, are metal lines formed above the polycrystalline silicon layer. In the presently preferred layout, the regions in the substrate employed for the resistor strings also are used as drain regions for the field-effect transistors. Moreover, adjacent switches (field-effect transistors) such as switches 76 and 80 of FIG. 3 share a common source region which region is coupled to the metal line 58 by a single metal contact.

Figure 5:
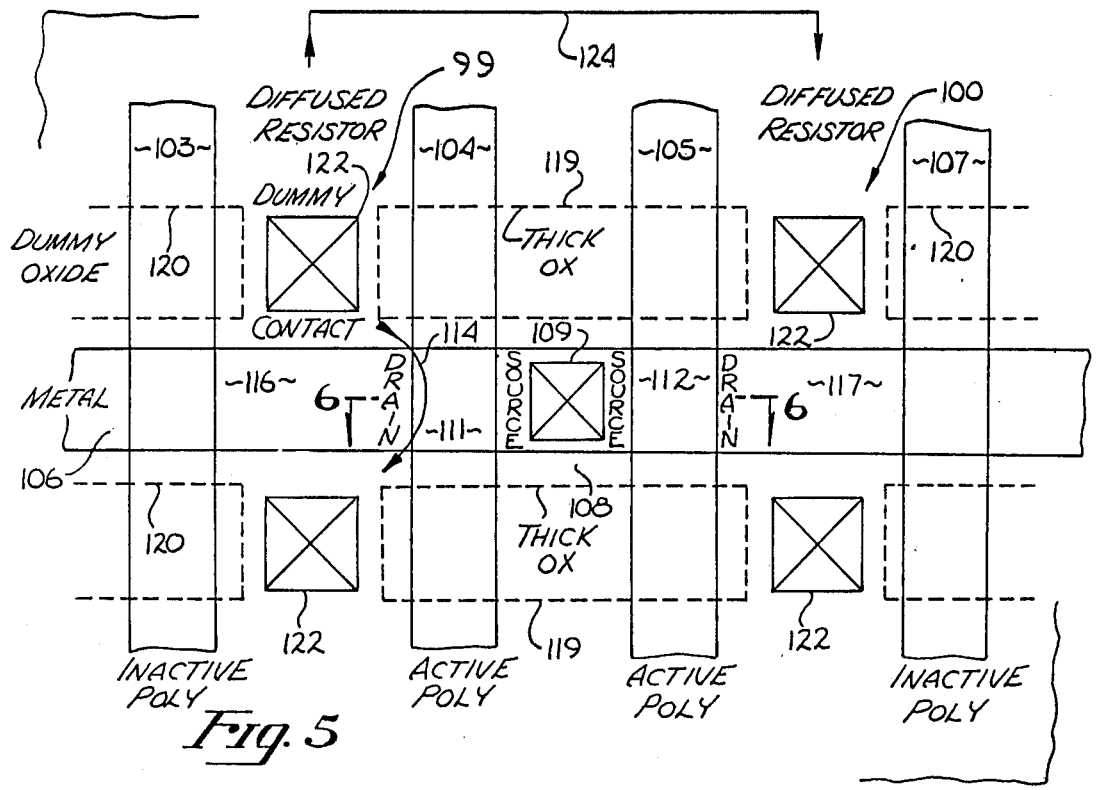
FIG. 5 is a plan view of a portion of a substrate illustrating the circuit layout employed in the digital-to-analog converter array of the present invention.

Referring to FIG. 5 and the layout for the presently preferred embodiment of the converter array, the converter array along with the decoding or gating means are fabricated on a p-type silicon substrate employing n-channel devices. Only a portion of an array is illustrated in FIG. 5, specifically two adjacent resistor strings shown as diffused resistor regions 99 and 100, and a transverse metal line 106. The switching means for selectively coupling these resistor regions to the line 106 is also shown in FIG. 5. By way of example, the diffused resistor regions 99 and 100 corresponds to the resistor strings 50 and 51, respectively of FIG. 3. The connection 55 between the strings 50 and 51 of FIG. 3 is shown as line 124 in FIG. 5. The single crossing metal line 106 of FIG. 5 corresponds to line 58 of FIG. 3. The output lines from the AND gates 70 and 71 of FIG. 3 are the polycrystalline strips 104 and 105, respectively of FIG. 5. The switch 76 of FIG. 3 is a field-effect transistor in FIG. 5 which includes a drain 116 which drain is integral with the diffused resistor region 99, and a common source region 108. The active channel region of this transistor is identified as channel 111. Similarly for the switch 80 of FIG. 3, a drain 117, common source region 108 and active channel 112 are shown in FIG. 5.

In the fabrication of the converter array the "front end" fabrication steps include the formation of the thick oxide layers 119 and the thick "dummy" oxide layers 120. The function of these relatively thick field oxides (e.g. 5,000 Å thick or thicker) will be explained later in this application. These oxides may be fabricated with well-known MOS processing steps.

After the thick oxides have been formed, a layer of polycrystalline silicon is deposited on the substrate and etched to form the spaced-apart, parallel, elongated strips 103, 104, 105 and 107. (Note, all the intermediate processing steps, which are well-known in the art, are not described). Next, an n-type dopant such as phosphorus or arsenic is diffused into the substrate in alignment with these silicon strips. An ordinary diffusion furnace may be employed for this purpose, or ion implantation may be used. Note that gaps exist between oxides 119 and 120 in the diffused resistor regions 99 and 100 allowing formation of the elongated resistor regions 99 and 100. Also, a generally rectangular opening defined by adjacent edges of strips 104 and 105, and by thick oxides 119 is simultaneously doped to form the common source region 108.

Figure 6:
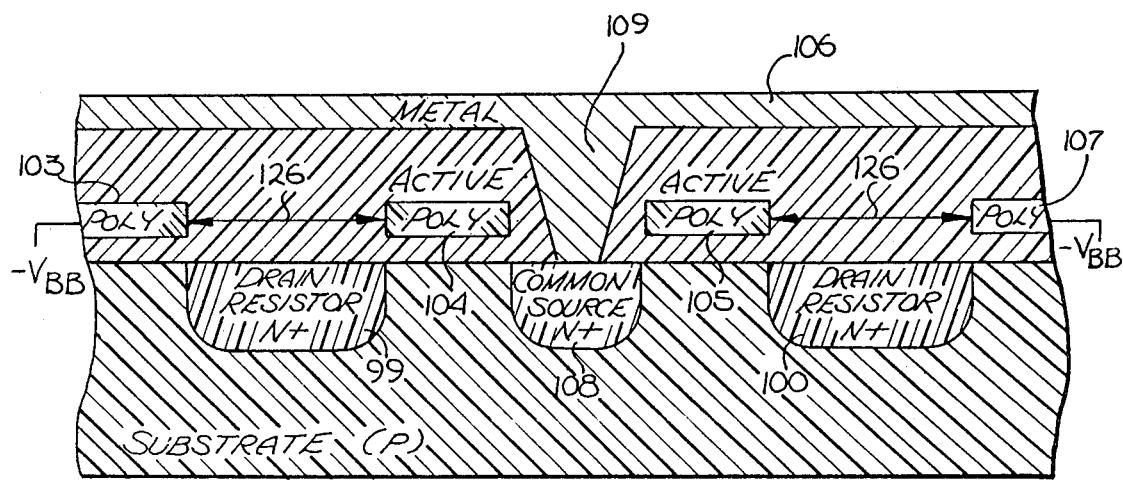
FIG. 6 is a cross-sectional elevation view of the substrate of FIG. 5 taken generally through section line 6—6 of FIG. 5.

Now a crossing metal layer is formed above the polycrystalline layer and insulated therefrom as is shown in the cross-sectional view of FIG. 6. This metal layer defines the line 106 and the contact 109 which contact couples the common source region 108 with line 107. Also a plurality of "dummy" metal contacts 122 are formed within the resistor regions 99 and 100 between the thick oxides 119 and the dummy oxides 120; the purpose of these contacts is described later in this application. Note that the dummy contacts 122 do not provide contact with any upper layer, but are employed for purposes of shunting the diffused resistor regions 99 to 100 at the gaps defined by the oxides 119 and 120. Other necessary metalization is also simultaneously formed such as the connections between the resistor strings (e.g. line 124).

It should be noted from FIGS. 5 and 6 that the diffused resistor regions 99 and 100 are defined by adjacent polycrystalline strips. Specifically, region 99 is formed in alignment with strips 103 and 104, while region 100 is formed in alignment with strips 105 and 107. The distance between these polycrystalline strips (shown as dimension 126 in FIG. 6) may be relatively uniform since the polycrystalline silicon strips are defined by the same masking operation. Note that if an oxide layer were used to define one edge of the diffused resistor regions, masking misalignment would make it difficult to maintain a uniform dimension 126. Thus by forming the diffused resistors between polycrystalline silicon strips (or equivalent metal lines) uniform resistance strings may be fabricated.

The silicon strips 104 and 105, as mentioned, are employed to form gates for the field-effect transistors; these strips are coupled to the decoding circuitry. However, the polycrystalline strips 103 and 107 are not coupled to active circuit devices, and hence are biased-off to prevent parasitic conduction. In the presently preferred embodiment the strips 103 and 107 are coupled to a negative potential, $V_{BB}$, which potential is also employed for substrate biasing. Ordinary metal contacts may be employed to couple these strips to the substrate.

Referring now to FIG. 5, one location (tap) along the diffused resistor region 99 may be selectively coupled to the metal line 106 by the application of a positive potential (for the n-channel embodiment) to the silicon line 104. The positive potential on line 104 causes an inversion layer within the channel 111 which results in conduction between the drain 116 and the source region 108. As is apparent when such conduction occurs, a portion of the diffused resistor region 99 is shunted, as shown by path 114. However, the sheet resistance associated with path 114 is substantially higher than the resistance of the diffused resistor region 99. Any shunting caused by the coupling of the resistor region 99 with the metal line 106 (and the other metal lines) does not substantially effect the resistance of resistor region 99. By way of example, the sheet resistance associated with path 114 is in the order of magnitude of 5,000 ohms, whereas each resistance segment of the 256 resistance segments employed for the eight-bit converter are approximately 50 ohms. Thus the shunting effect is minimal.

The thick oxide strips 119 which are generally parallel to the metal line 106 are employed to prevent parasitic conduction between adjacent transistors in the array. These oxides are disposed beneath the silicon strips 104 and 105. It is difficult to fabricate these oxides such that they uniformly extend into, or terminate at, the diffused resistor regions because of masking alignment errors. Thus these oxides may tend to pinch-off one resistor region while leaving a larger gap in an adjacent resistor region. For example a higher resistance may result in region 99 and a lower resistance in region 100 if the oxides 119 are shifted to the left. This will result in non-uniform resistance and a non-linear output from the converter. In order to correct for this alignment problem, dummy oxides 120 are employed. (These thick dummy oxides are not needed under strips 103 and 106 to prevent parasitic conduction since these strips are biased-off.) The oxides 119 and 120 are fabricated with the same masking step, thus the gaps or spaces between the oxides 119 and 120 (at the resistor regions) will be uniform even though these gaps may not fall within the center of each resistor regions. Therefore, the dummy oxides reduce the first order effects caused by mask alignment difficulties.

Figure 7:
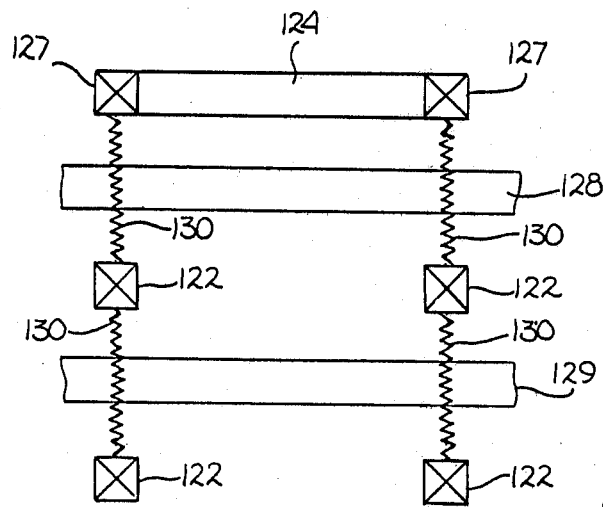
FIG. 7 is a schematic drawing of the ends of two adjacent resistor strings of a converter. This drawing is used to describe the use of the "dummy" contacts employed in the presently preferred embodiment.

In FIG. 7 a portion of the array of FIGS. 5 and 6 is again illustrated and includes a plurality of resistors 130 disposed between each of the dummy contacts 122. The resistors 130 correspond to the diffused resistor regions 99 and 100 of FIGS. 5 and 6. The ends of these diffused resistor lines terminate in contacts 127 which are interconnected by line 124. The line 124 in the presently preferred embodiment is a metal line fabricated simultaneously with the metal or row lines such as lines 128 and 129 of FIG. 7, or line 106 of FIGS. 5 and 6. As may be seen graphically from FIG. 7 the resistors 130 have a uniform resistance between each of the metal contacts. There is no discrete tap, or tap point, along these resistors. When the metal cross lines are coupled to one of the resistors 130, the metal line is, in effect, coupled to the midpoint of the resistor 130 thus the resistors have "virtual" taps rather than discrete taps.

The contacts 127 of FIG. 7 and like contacts associated with the ends of each of the resistor strings are required to couple the diffused regions in the substrate to line 124 which connects the resistors in series. The contacts 127 slightly change the values of the resistors at the two ends of the strings. The dummy contacts 122 are used to change the resistors within the strings to make them electrically identical to the end resistors and thereby to compensate for the contacts 127 and provide uniform resistance definition in the diffused resistor regions. In the presently preferred embodiment as is best seen in FIG. 5 these dummy contacts are disposed uniformly in these diffused regions between the oxides 119 and 120.

In some applications non-linear conversion is required. Often piece-wise linear approximations to non-linear functions, such as logarithmic functions, are used. One application for non-linear conversion is in telephone pulse code modulation (PCM) such as the $\mu=255$ law used in U.S. telephony or the CCITT law used in European telephony.

Figure 8:
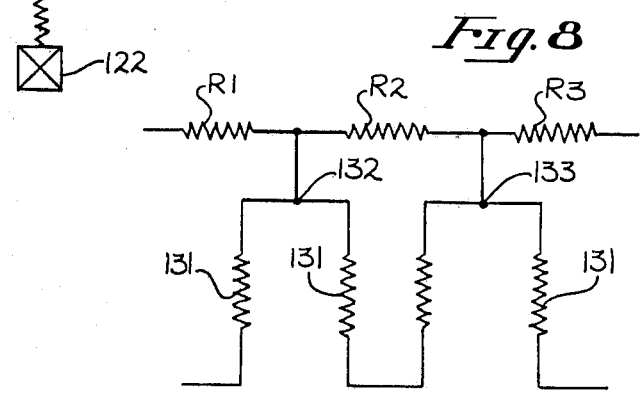
FIG. 8 is a schematic drawing of resistor strings in the converter coupled to additional resistors to provide non-linear conversion.

The converter of the present invention may be readily employed in such non-linear conversion applications. In FIG. 8 a plurality of resistor strings 131 are coupled in series by connections 132 and 133 and other connections. The resistor strings 131 correspond to the diffused resistor regions 99 and 100 of FIGS. 5 and 6, or the resistor strings 49 through 52 of FIG. 3. To provide the non-linear conversion, resistors are coupled between the connectors used to couple the resistor strings in series. This is shown in FIG. 8 by resistors $R_1$, $R_2$ and $R_3$; resistor $R_2$ is coupled between connections 132 and 133. In the presently preferred embodiment these resistors, such as resistors $R_1$, $R_2$ and $R_3$ are external resistors.

Figure 9:
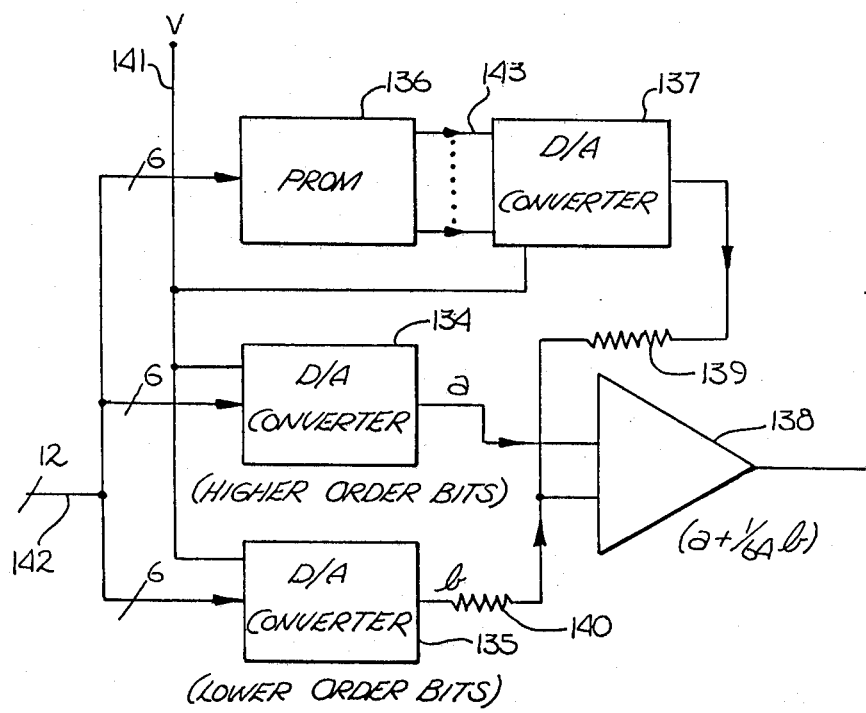
FIG. 9 is a block diagram of a system which employs a plurality of converters coupled to operate as a single digital-to-analog converter.

As mentioned in the presently preferred embodiment, an eight-bit converter may be fabricated on a substrate area of approximately 20×30 mils. A ten-bit converter requires a substrate area of approximately 40×60 mils, four times the area required for the eight-bit converter. As is readily apparent, the substrate area required for the converter substantially increases as the number of bits increase. For example, for a twelve-bit converter, fabricated as described above, a substrate area of approximately 80×120 mils is required. In FIG. 9 a twelve-bit converter is illustrated which does not require such a large substrate area.

In the circuit of FIG. 9 the twelve-bit input digital signal is applied to line 142. The least significant or lower order bits are coupled to a digital-to-analog converter 135. The higher order or more significant bits are coupled to the digital-to-analog converter 134. These high order bits are also coupled to a programmable read-only memory (PROM) 136. The output of the PROM, lines 143, are coupled to a digital-to-analog converter 137. The digital-to-analog converters 134, 135 and 137 in the presently preferred embodiment, each are fabricated as described above, for example, each may be fabricated as shown in FIGS. 5 and 6. Each of these converters are coupled to the same reference potential by line 141. The converters 134 and 135 are each six-bit converters.

The analog output of the digital-to-analog converter 134, shown as "a", is coupled to one input terminal of an operational amplifier 138. The analog output of the converter 135 ("b") is coupled to the other input terminal of amplifier 138 through resistor 140. The output of the operational 138 is equal to $a+1/64b$. The analog output of converter 137 is coupled to the operational amplifier 138 through resistor 139 to provide compensation as will be described.

First, the operation of the converter system of FIG. 9 will be examined without reference to the PROM 136 and the converter 137. The least significant bits of the input signal are converted to analog form within the converter 135. The most significant bits are converted to analog form within the converter 134. Operational amplifier 138 combines the two outputs, however, only one-sixtyfourth of the output of converter 135 is included within the output signal of amplifier 138. That is, the significance at the output of amplifier 138 of the input to the converter 135 is reduced by $2^6$. Therefore, the output from the amplifier 138 will be equivalent to the twelve-bit digital signal applied to line 142.

As is apparent the conversion errors of converter 134 are sixty-four times more significant than those associated with converter 135. Thus, even minor errors introduced by converter 134 can become significant. In order to compensate for this, the PROM 136 and the converter 137 are employed. PROM 136 receives the most significant six-bits as an address and then provides a digital output signal on lines 143. In the presently preferred embodiment this output signal is a six-bit or eight-bit signal. The output of the PROM 136 is then converted to analog form and added through resistor 139 to the output of converter 135.

For each digital input to converter 134, the output of this converter is measured and the error associated with each input is determined. The analog signal at the output of converter 137 required to correct each error is also determined. The input to converter 137 necessary to obtain each required analog signal is programmed into the PROM 136 for each of the digital inputs to converter 134. It should be noted that there may be no correlation between the input to the PROM and its output. With this system the PROM 136 and converter 137 can provide correction to a level equivalent to the least significant bit applied to converter 135.

Thus, a digital-to-analog converter has been described which may be fabricated with known MOS technology. The converter array may be formed in a relatively small substrate area. The unique layout minimizes inaccuracies from masking misalignments.

We claim:

1. An MOS array disposed on a silicon substrate for converting a digital signal to an analog signal including:
   a first and second elongated, generally parallel, spaced-apart, doped regions in said substrate, each for forming a resistance means;
   a first and second, elongated, generally parallel, spaced-apart strips of polysilicon disposed between and parallel to said spaced-apart first and second regions, said first strip adjacent to said first region and said second strip adjacent to said second region;

a first and a second conductive line disposed generally transverse to and insulated from said strips and said first and second regions, said conductive lines crossing said regions and said strips;

third and fourth doped regions in said substrate disposed between said spaced-apart first and second strips, said third region being disposed below said first line and said fourth region being disposed below said second line;

contact means for coupling said third doped region with said first line and for coupling said fourth region with said second line;

whereby one of said first and second regions may be coupled to said lines through said third or fourth regions by applying a potential to one of said first and second strips.

2. The MOS array defined by claim 1 including oxide layers disposed at least under said first and second strips on opposite sides of said third and fourth regions, and between said third and fourth regions, said oxide layers for preventing parasitic conduction from said first and second regions when said potentials are applied to one of said strips.

3. The MOS array defined by claim 2 wherein metal contacts are used at one end of said first and second regions to allow said first and second regions to be coupled in series, and wherein shunting means for providing low resistance, conductive paths are provided in said first and second regions adjacent to said oxide layers to provide compensation for said metal contacts.

4. The MOS array defined by claim 3 wherein said shunting means comprise metal members contacting said first and second regions.

5. The MOS array defined by claim 4 wherein said first, second, third and fourth regions are n-type regions, said third and fourth regions forming common source regions for pairs of field-effect transistors, the drains of these transistors being said first and second regions.

6. An MOS array disposed on a silicon substrate for converting a digital signal to an analog signal including:

a first, second, third, and fourth, generally parallel, spaced-apart strips of polysilicon disposed on said substrate;

a first elongated, doped region for forming a first resistance means in said substrate, disposed between said first and second strips;

a second elongated, continuous doped region for forming a second resistance means in said substrate, disposed between said third and fourth strips;

third and fourth doped regions disposed between said second and third strips;

a first elongated conductive line, disposed generally transverse to said first, second, third and fourth strips, said first line being disposed above said third region;

a second elongated conductive line, disposed generally transverse to said first, second, third and fourth strips, said second line being disposed above said fourth region; and, contact means for electrically coupling said third region to said first line, and said fourth region to said second line;

whereby one of said first and second resistance means may be selectively coupled to said lines by application of a potential to one of said second and third strips.

7. The MOS array defined by claim 6 including a plurality of oxide members, disposed generally parallel to said lines on opposite sides of said third and fourth regions and between said third and fourth regions, said oxide members defining gaps at said first and second regions to allow doping of these regions, whereby any misalignment between said oxide members and said first and second regions results in a uniform effect on said first and second regions.

8. The MOS array defined by claim 7 including metal contacts disposed at one end of said first and second regions to allow said first and second regions to be coupled in series, and also including shunting means for providing low resistance conductive paths, disposed in said first and second regions within said gaps to compensate for said metal contacts.

* * * * *